United States Patent
Fukuda et al.

(10) Patent No.: US 11,300,693 B2
(45) Date of Patent: Apr. 12, 2022

(54) RADIATION DETECTION MATERIAL AND RADIATION DETECTION DEVICE

(71) Applicant: KABUSHIKI KAISHA TOSHIBA, Tokyo (JP)

(72) Inventors: Yumi Fukuda, Tokyo (JP); Keiko Albessard, Kanagawa (JP); Kenji Essaki, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 17/014,291

(22) Filed: Sep. 8, 2020

(65) Prior Publication Data
US 2021/0199818 A1 Jul. 1, 2021

(30) Foreign Application Priority Data
Dec. 27, 2019 (JP) .............................. JP2019-239117

(51) Int. Cl.
*G01T 1/20* (2006.01)
*C09K 11/77* (2006.01)
*H01L 27/146* (2006.01)

(52) U.S. Cl.
CPC ........ *G01T 1/2018* (2013.01); *C09K 11/7773* (2013.01); *H01L 27/14663* (2013.01)

(58) Field of Classification Search
None
See application file for complete search history.

(56) References Cited

U.S. PATENT DOCUMENTS
10,377,945 B2  8/2019  Stand et al.

FOREIGN PATENT DOCUMENTS
JP    2017-519856 A    7/2017

OTHER PUBLICATIONS

Yutaka Fujimoto et al., "Thallium magnesium chloride: A high light yield, large effective atomic number, intrinsically activated crystalline scintillator for X-ray and gamma-ray detection," Japanese Journal of Applied Physics, 55 (090301-1 to -3) (2016).

Masahiro Kazama et al., "Aquilion ONE / ViSION Edition CT Scanner Realizing 3D Dynamic Observation with Low-Dose Scanning," Toshiba Review, vol. 70, No. 7, pp. 10-13 (2015).

*Primary Examiner* — Edwin C Gunberg
(74) *Attorney, Agent, or Firm* — Finnegan, Henderson, Farabow, Garrett & Dunner L.L.P.

(57) ABSTRACT

The embodiments provide a radiation detection material emitting fluorescence with high intensity and short lifetime, and also provide a radiation detection device. The polycrystalline radiation detection material of the embodiment is represented by the following formula (1)

$$TlM_{1-x-y}R_xX_{3-z} \qquad (1).$$

In the formula, M is at least one metal element selected form the group consisting of Ca, Sr, Ba and Mg; R is at least one luminescence center element selected form the group consisting of Ce, Pr, Yb and Nd; X is at least one halogen element selected form the group consisting of Cl, Br and F; and x, y and z are numbers satisfying the conditions of
$0 \leq x \leq 0.5$,
$-0.1 \leq y \leq 0.1$, and
$-0.5 \leq z \leq 1$, respectively.

8 Claims, 5 Drawing Sheets

RADIATION DETECTION MATERIAL AND RADIATION DETECTION DEVICE

CROSS-REFERENCE TO RELATED APPLICATIONS

This application is based upon and claims the benefit of priority from the prior Japanese Patent Application No. 2019-239117, filed on Dec. 27, 2019, the entire contents of which are incorporated herein by reference.

FIELD

Embodiments of the present disclosure relate to a radiation detection material and a radiation detection device.

BACKGROUND

Radiation is widely used in the medical field, for example, for particle therapy and for diagnostic imaging such as positron emission tomography (PET) and X-ray computed tomography (X-ray CT), and also broadly used in the industrial and agricultural fields, for example, for sterilization treatment and for polymer processing. When radiation is thus used, a radiation detection device is indispensable. For example, the aforementioned X-ray CT is a means for obtaining a tomographic image of the sample or patient, and the measurement process thereof comprises the steps of: inserting the sample or patient into the center of detection devices that are arranged in an arc and positioned opposite to the X-ray source, then rotating (for tomographic scanning) the X-ray source and the devices (or the sample or patient), and subsequently computer-processing the obtained transmission images to obtain the tomographic image. Further, it is also possible to obtain a three-dimensional image by use of this technology. In that case, scanning is repeated twice or more while the sample or patient is being moved along the axis of rotation. The X-ray CT has such high position resolution that even a minute lesion can be detected early, and hence is used as a means for diagnosing various diseases, such as, mainly cancer.

As described above, radiation detection devices are widely used for various purposes, such as, lesion diagnosis in the medical field and nondestructive inspection in the industrial field.

DETAILED DESCRIPTION

A polycrystalline radiation detection material according to the embodiment is represented by the following formula (1):

$$TlM_{1-x-y}R_xX_{3-z} \tag{1}$$

wherein

M is at least one metal element selected form the group consisting of Ca, Sr, Ba and Mg;

R is at least one luminescence center element selected form the group consisting of Ce, Pr, Yb and Nd;

X is at least one halogen element selected form the group consisting of Cl, Br and F; and x, y and z are numbers satisfying the conditions of
$\le x \le 0.5$,
$-0.1 \le y \le 0.1$, and
$-0.5 \le z \le 1$, respectively.

Embodiments will now be explained with reference to the accompanying drawings.

Here, it should be noted that the drawings are schematic views and hence, for example, the relation between thickness and width of each part and the size ratios among the parts are not necessarily the same as real ones. In different drawings, even the same components may be drawn in different dimensions and proportions.

Further, in the present specification and drawings, the component similar to that illustrated before in a drawing already shown and described is numbered with the same number and explanation thereof may be omitted.

The radiation detection material of the embodiment has a polycrystalline structure represented by the following formula (1):

$$TlM_{1-x-y}R_xX_{3-z} \tag{1}.$$

In the formula, x, y and z are numbers satisfying the conditions of
$0 \le x \le 0.5$,
$-0.1 \le y \le 0.1$, and
$-0.5 \le z \le 1$, respectively.

This crystalline structure generally is of perovskite.

In the above formula (1), M contains at least one selected form the group consisting of Ca (calcium), Sr (strontium), Ba (barium) and Mg (magnesium); R contains at least one selected form the group consisting of Ce (cerium), Pr (praseodymium), Yb (ytterbium) and Nd (neodymium); and X contains at least one selected form the group consisting of Cl (chlorine), Br (bromine) and F (fluorine). Hereinafter in the present specification, the content in the material composition is expressed in terms of molar concentration unless otherwise noted.

The material of the embodiment has a crystal structure comprising Tl (thallium), the metal element M and the halogen element X. In the crystal structure, the metal element M may be partly replaced with the luminescence center element R.

The metal element M contains at least one selected form the group consisting of Ca, Sr, Ba and Mg. However, the element M preferably contains Mg, and more preferably M is Mg. When the element M contains Mg, the material shows intense luminescence. Further, when M is Mg, the element M enables the material to achieve more intense luminescence.

If contained in the material, the element R functions as the luminescence center of the radiation detection material. On the other hand, even if not containing the element R, the radiation detection material emits light according to another mechanism (described in detail later). The luminescence center element R contains at least one selected form the group consisting of Ce, Pr, Yb and Nd. However, it preferably contains Ce. The material containing Yb, Pr and/or Nd emits luminescence with a short lifetime. That is because the emission processes of $Yb^{2+}$, $Pr^{3+}$ and $Nd^{3+}$ are a parity-allowed transition of $4f^{12}5d^1 \rightarrow 4f^{13}$, a spin-allowed transition of $^3P_0 \rightarrow {}^3H_j$, $^3F_j$, and a parity-allowed transition of $4f^25d^1 \rightarrow 4f^3$, respectively. Meanwhile, as for Ce, the material containing $Ce^{3+}$ emits luminescence with such a shorter emission lifetime (fluorescence lifetime) that radiation can be detected accurately enough to reduce the radiation dose. The reason thereof is that the emission process of $Ce^{3+}$ is a $5d^1 \rightarrow 4f^1$ transition, which is not only parity-allowed but also spin-allowed because $5d^1$ and $4f^1$ are both spin doublet states. In addition, the peak wavelength in the emission spectrum of the material depends on the luminescence center element, which can be hence selected according to the sensitivity and the like of a detector with which the emission is observed. The emission spectrum shown by the material containing Ce is suitable for a normal detector containing silicon semiconductor.

The halogen element X serves as a counter ion to Tl, the metal element M and the luminescence center R. The halogen element X contains at least one selected form the group consisting of Cl, Br and F. It may be a combination of two or more halogen elements, but preferably consists of a single element and more preferably X is Cl.

The number represented by x is an amount of the luminescence center element R, and satisfies the condition of $0 \leq x \leq 0.5$ in the embodiment. Under the condition of x=0, that is, when the material does not contain the element R, luminescence is emitted from self-trapped excitons. Specifically, when the material is exposed to radiation, many self-trapped excitons are generated and then recombined to emit light. Under the condition of x>0, that is, when the material contains the element R, the element R serves as a luminescence center. Specifically, when the material is exposed to radiation, many electron-hole pairs are generated in the crystal by the radiation energy and then the energy of the many electron-hole pairs is transferred to the R ion directly or via self-trapped excitons. The R ion is excited by the transferred energy, and then emits light while returning to the ground state. For example, under the conditions of R=Ce and x>0, many electron-hole pairs are generated in the crystal by the incident radiation energy and then the energy of the many electron-hole pairs is transferred to $Ce^{3+}$, which is excited by the transferred energy. The excited $Ce^{3+}$ emits light while returning to the ground state. It is preferred to adopt $Ce^{3+}$ because luminescence with a short lifetime can be obtained.

The material of the embodiment contains Tl, M and X. As described above, even if the material does not contain R (i.e., x=0), it is possible to obtain a sufficient amount of luminescence. However, the element M in an amount of at least 0.1 mol % is preferably replaced with R, so as to obtain more intense luminescence. Half of the element M may be replaced with R (i.e., x=0.5). However, under the condition of $x \leq 0.1$, intensity reduction (concentration quenching) of the luminescence can be avoided as much as possible. Accordingly, the number represented by x preferably satisfies the condition of: $0.001 \leq x \leq 0.1$. When x is larger than 0.5, the distance among the R ions is so short that energy migration, namely, concentration quenching may occur and hence that the luminescence tends to be weakened. That is unfavorable. When the radiation detection material of the embodiment contains the luminescence center element R, the peak wavelength in the emission spectrum shown by the material exposed to radiation can be easily adjusted to the wavelength at which a detector based on silicon semiconductor has high sensitivity. The material of the embodiment emits light when excited by radiation such as γ-rays. The peak wavelength in the spectrum of the emitted light corresponds to that of, for example, the fluorescence emitted from the fluorescent ingredient. Examples of the detector include silicon semiconductor-containing photodiodes (PDs) and silicon photomultipliers (Si-PMs).

The number represented by y indicates a deviation from the total stoichiometric amount of M and R, namely 1. It satisfies the condition of $-0.1 \leq y \leq 0.1$. The number y in this range ensures, for example, that heterogeneous phase formation is inhibited and accordingly that the luminescence intensity is enhanced. It preferably satisfies the condition of $-0.05 \leq y \leq 0.05$ because nonradiative transition can be easily inhibited.

In the embodiment, the number represented by z satisfies the condition of $-0.5 \leq z \leq 1$. The number z in this range ensures, for example, that the crystallinity can be improved. If it is out of the above range, there is a fear that, for example, anion and cation defects may increase to lower the crystallinity. It preferably satisfies the condition of $-0.05 \leq z \leq 0.1$ because the crystallinity can be further improved.

Even if other elements such as inevitable impurities are contained in an amount of about 10 mol % or less based on the amount of R, the desired properties are not impaired. Examples of those elements include Mn.

The material of the embodiment has a polycrystalline structure. The crystal structure of the material can be confirmed by observation with scanning electron microscopy (SEM). The SEM observation is carried out, for example, in the following manner. The material is fixed on a carbon tape and observed with JSM-6510LA ([trademark], manufactured by JEOL Ltd.) by use of a scanning electron beam at an accelerating voltage of 15 kV. The material according to the embodiment is an aggregate of polycrystallites having particle sizes of 10 nanometers to 100 micrometers.

The material of the embodiment generally has a high density. The density of the material is preferably high enough to increase probability of interaction between the material and radiation. Further, the material preferably contains atoms of high atomic numbers because the probability of interaction with radiation increases according as the effective atomic number increases. Since Tl (thallium) has an atomic number as high as 81, the material containing Tl as a constituting element can interact with radiation with extremely high probability and hence has high detection sensitivity. The material according to the embodiment also has high energy resolution. It is thus possible to obtain the material having, for example, a high density, high luminescence intensity and high energy resolution.

In the embodiment, the material is constituted of crystals having perovskite structures. However, the crystals do not necessarily have perfect perovskite structures in the whole material. For example, they may have distorted perovskite structures with defects or excess of X atoms. When there are defects or excess of X atoms, the numbers y and z often do not correspond to the stoichiometric values. Further, the sites of Tl may be partly occupied with M atoms, or the sites of M may be partly occupied with Tl atoms. In those cases, the numbers y and z also often do not correspond to the stoichiometric values. It can be judged from the XRD profile whether the crystal structures are distorted or not.

The radiation detection material described above shows emission of high intensity with a short lifetime. This material makes it possible to produce a radiation detection device excellent in detection properties.

The compound according to the embodiment can be produced, for example, in the following manner.

As the powdery starting materials, a thallium compound, a M-containing compound and an R-containing compound are weighed and mixed. The thallium compound, the M-containing compound and the R-containing compound are preferably a thallium halide, a halogenated M compound and a halogenated R compound, respectively. They may be mixed in either a dry or wet process. The mixture thus prepared is then subjected to heat treatment at a temperature of 200 to 1000° C. inclusive in a vacuum atmosphere. The temperature condition is so determined that the starting materials may not insufficiently decompose, that the aimed compound may not be insufficiently produced, and that the produced compound may not decompose, melt or sublimate. The time of the heat treatment can be changed according to the temperature condition, but is preferably 1 to 150 hours inclusive. The degree of vacuum in the heat treatment is preferably $5 \times 10^{-4}$ Pa or more, further preferably $1 \times 10^{-4}$ Pa or more.

The powdery product thus obtained can be, for example, dispersed in a resin and employed as a scintillator material. In another way, the powdery product may be subjected to compression molding and then optionally subjected to heat treatment. If needing to be in the form of a molded body, the product is molded into an aimed form, for example, by cold isostatic pressing (CIP) or with a hand press machine and then sintered. It is also possible to adopt other processes, such as, electric plasma sintering, hot pressing and hot isostatic pressing (HIP). The electric plasma sintering can be carried out in either a vacuum or argon atmosphere.

The embodiments will be explained by Examples and Comparative example described below.

EXAMPLES

Example 1

As the powdery starting materials, thallium chloride (TlCl) powder (99.9%) and anhydrous magnesium chloride (MgCl$_2$) powder (99.9%) are prepared. Those material powders are mixed so that the mixture may have a composition corresponding to TlMgCl$_3$.

The material powder mixture is then enveloped in a foil of high melting point metal such as tantalum (Ta), subsequently placed in a quartz tube, and thereafter dried in vacuum at 300° C. for 6 hours. After the mixture is cooled to room temperature, the quartz tube is sealed off. The degree of vacuum in the sealed tube was found to be $9.0 \times 10^{-5}$ Pa. The vacuum-sealed tube is subjected to heat treatment in which the temperature is slowly lowered from 650° C. to 500° C. for 30 hours. In this manner, a radiation detection material can be obtained. The obtained material comprises a polycrystalline complex chloride having a composition represented by TlMgCl$_3$. After the quartz tube was cooled to room temperature, the complex chloride was taken out of the tube and then pulverized in a mortar to produce a sample powder of Example 1.

Example 2

The procedures of Example 1 were repeated except for changing magnesium chloride into calcium chloride (CaCl$_2$), to produce a sample powder of Example 2.

Example 3

The procedures of Example 1 were repeated except for changing anhydrous magnesium chloride into strontium chloride (SrCl$_2$), to produce a sample powder of Example 3.

Example 4

As the powdery starting materials, thallium chloride (TlCl) powder, cerium chloride (CeCl$_3$) powder and magnesium chloride (MgCl$_2$) powder are prepared. Those material powders are mixed so that the mixture may have a composition corresponding to Tl(Mg$_{0.99}$Ce$_{0.01}$)Cl$_3$. The material powder mixture is then dried, subjected to heat treatment, and pulverized in the same manner as in Example 1, to produce a sample powder of Example 4.

Example 5

The procedures of Example 4 were repeated except for changing the composition of the powdery material mixture into that corresponding to Tl(Mg$_{0.98}$Ce$_{0.02}$)Cl$_3$, to produce a sample powder of Example 5.

Example 6

The procedures of Example 4 were repeated except for changing the composition of the powdery material mixture into that corresponding to Tl(Mg$_{0.98}$Ce$_{0.03}$)Cl$_3$, to produce a sample powder of Example 6.

Example 7

The procedures of Example 4 were repeated except for changing the composition of the powdery material mixture into that corresponding to Tl(Mg$_{0.95}$Ce$_{0.05}$)Cl$_3$, to produce a sample powder of Example 7.

Comparative Example

As the powdery starting materials, thallium chloride (TlCl) powder, europium chloride (EuCl$_2$) powder and magnesium chloride (MgCl$_2$) powder are prepared. Those material powders are mixed so that the mixture may have a composition corresponding to Tl(Mg$_{0.9}$Eu$_{0.1}$)Cl$_3$. The material powder mixture is then dried, subjected to heat treatment, and pulverized in the same manner as in Example 1, to produce a sample powder of Comparative example.

Example 8

From the sample powder of Example 1, a sintered body was produced by spark plasma sintering in the following manner. The sample powder of Example 1 in an amount of 0.8 g was weighed out and loaded in a sintering mold comprising a carbon-made cylindrical die of 10 mm diameter and a pinch jig. The sintering mold was then placed in a chamber of spark plasma sintering apparatus DR. SINTER SPS-511S ([trademark], manufactured by Sumiseki Materials Co., Ltd.), and thereafter the chamber was evacuated to 8 Pa. In a vacuum degree of 8 Pa, the sintering mold was heated at 400° C. for 10 minute while loaded with a pressure of 3.6 kN (45 Mpa). After cooled to room temperature, the sintered body was taken out of the sintering mold and then the surface thereof was polished.

Example 9

The procedures of Example 8 were repeated except for employing the sample powder of Example 4, to produce a sintered body of Example 9.

Example 10

The procedures of Example 9 were repeated except for changing the sintering atmosphere into atmospheric pressure Ar gas atmosphere, to produce a sintered body of Example 10.

Example 11

As the powdery starting materials, thallium chloride (TlCl) powder (99.9%) and anhydrous magnesium chloride ($MgCl_2$) powder (99.9%) are prepared. Except for using a mixture of those powdery starting materials, the procedures of Example 10 were repeated to produce a sintered body of Example 11.

The samples of Examples 1 to 11 were subjected to composition analysis. For analyzing metal ions, each sample was decomposed by acid and then analyzed by ICP emission spectroscopy with SPS-3520UV ([trademark], manufactured by Hitachi High-Tech Science Corporation). For analyzing chlorine, each sample was decomposed by thermal hydrolysis and then analyzed by ion chromatography with ICS-2000 ([trademark], manufactured by Thermo Fisher Scientific K.K). The results are as follows.

In the sample of Example 1, when the composition ratio is normalized on the assumption that the total content of Tl is regarded as 1, the contents of Mg and Cl are 0.99 and 2.7, respectively. This composition ratio corresponds to a case of $x=0$, $y=0.01$ and $z=-0.3$ in formula 1.

In the sample of Example 2, when the composition ratio is normalized on the assumption that the total content of Tl is regarded as 1, the contents of Ca and Cl are 0.95 and 3.1, respectively. This composition ratio corresponds to a case of $x=0$, $y=0.05$ and $z=-0.1$ in formula 1.

In the sample of Example 3, when the composition ratio is normalized on the assumption that the total content of Tl is regarded as 1, the contents of Sr and Cl are 1.02 and 3.2, respectively. This composition ratio corresponds to a case of $x=0$, $y=0.01$ and $z=-0.2$ in formula 1.

In the sample of Example 4, when the composition ratio is normalized on the assumption that the total content of Tl is regarded as 1, the contents of Mg, Ce and Cl are 0.99, 0.01 and 2.9, respectively. This composition ratio corresponds to a case of $x=0.01$, $y=0.00$ and $z=0.1$ in formula 1.

In the sample of Example 5, when the composition ratio is normalized on the assumption that the total content of Tl is regarded as 1, the contents of Mg, Ce and Cl are 0.97, 0.02 and 2.8, respectively. This composition ratio corresponds to a case of $x=0.02$, $y=-0.01$ and $z=0.2$ in formula 1.

In the sample of Example 6, when the composition ratio is normalized on the assumption that the total content of Tl is regarded as 1, the contents of Mg, Ce and Cl are 0.97, 0.03 and 2.7, respectively. This composition ratio corresponds to a case of $x=0.03$, $y=0.00$ and $z=0.3$ in formula 1.

In the sample of Example 7, when the composition ratio is normalized on the assumption that the total content of Tl is regarded as 1, the contents of Mg, Ce and Cl are 0.97, 0.04 and 2.6, respectively. This composition ratio corresponds to a case of $x=0.04$, $y=-0.01$ and $z=0.4$ in formula 1.

In the sample of Example 8, when the composition ratio is normalized on the assumption that the total content of Tl is regarded as 1, the contents of Mg and Cl are 0.98 and 2.4, respectively. This composition ratio corresponds to a case of $x=0$, $y=0.02$ and $z=-0.6$ in formula 1.

In the sample of Example 9, when the composition ratio is normalized on the assumption that the total content of Tl is regarded as 1, the contents of Mg, Ce and Cl are 0.96, 0.01 and 2.3, respectively. This composition ratio corresponds to a case of $x=0.01$, $y=0.03$ and $z=-0.7$ in formula 1.

In the sample of Example 10, when the composition ratio is normalized on the assumption that the total content of Tl is regarded as 1, the contents of Mg, Ce and Cl are 0.98, 0.01 and 2.9, respectively. This composition ratio corresponds to a case of $x=0.01$, $y=0.01$ and $z=0.1$ in formula 1.

In the sample of Example 11, when the composition ratio is normalized on the assumption that the total content of Tl is regarded as 1, the contents of Mg and Cl are 1.00 and 2.9, respectively. This composition ratio corresponds to a case of $x=0$, $y=0.00$ and $z=0.1$ in formula 1.

Figure 1:
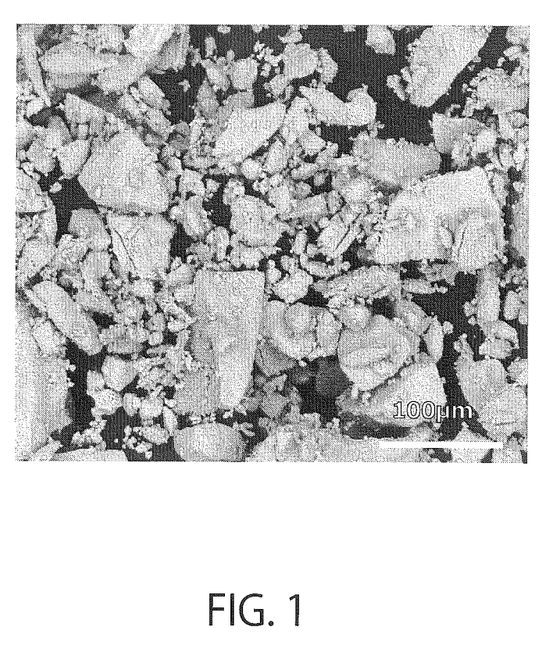
FIG. 1 is a SEM observation image of the material in Example 1.
Figure 2:
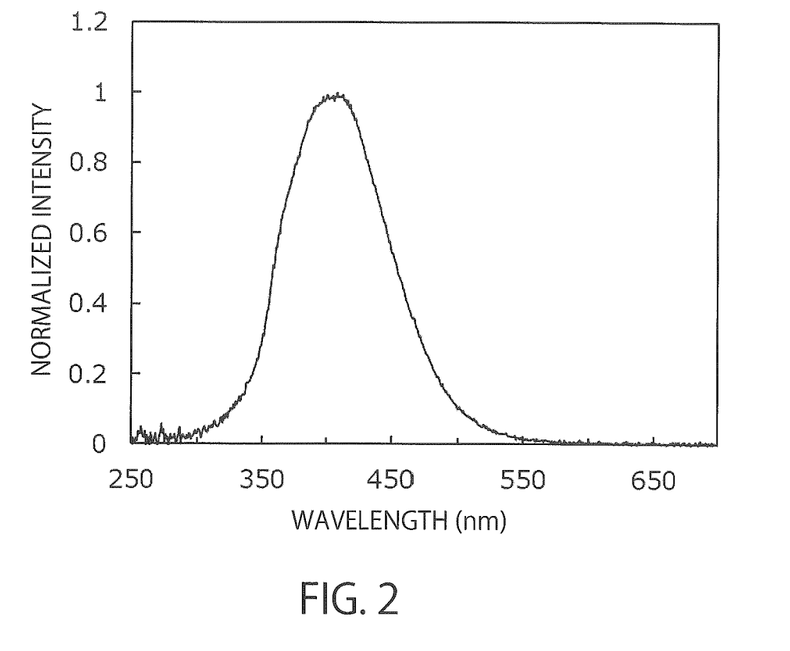
FIG. 2 is an example of the emission spectrum shown by the material in Example 1 under the excitation with electron beams.
Figure 3:
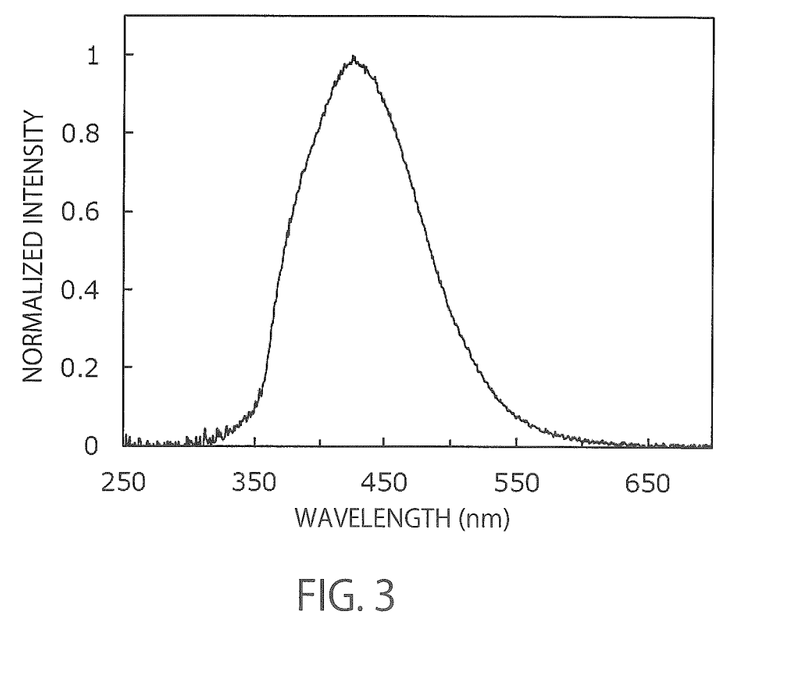
FIG. 3 is an example of the emission spectrum shown by the material in Example 3 under the excitation with electron beams.
Figure 4:
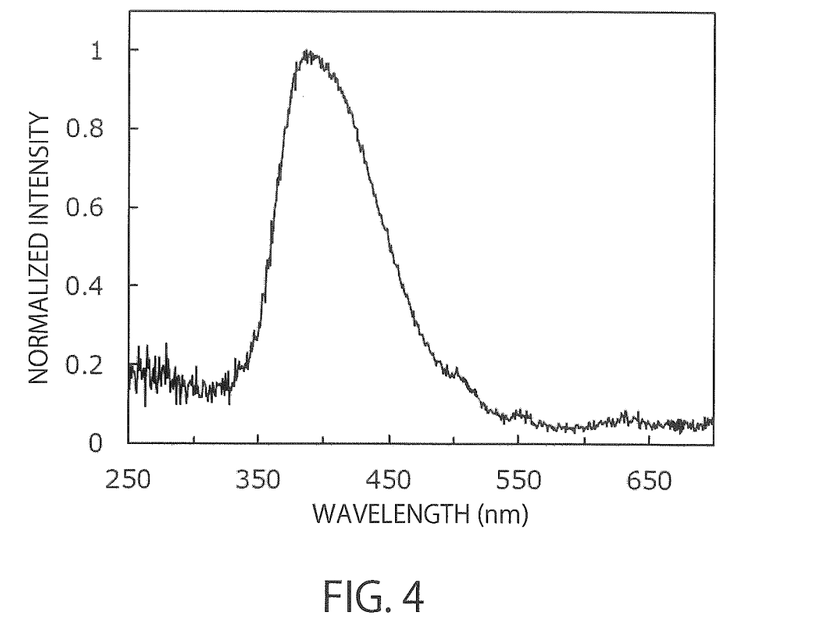
FIG. 4 is an example of the emission spectrum shown by the material in Example 4 under the excitation with electron beams.
Figure 5:
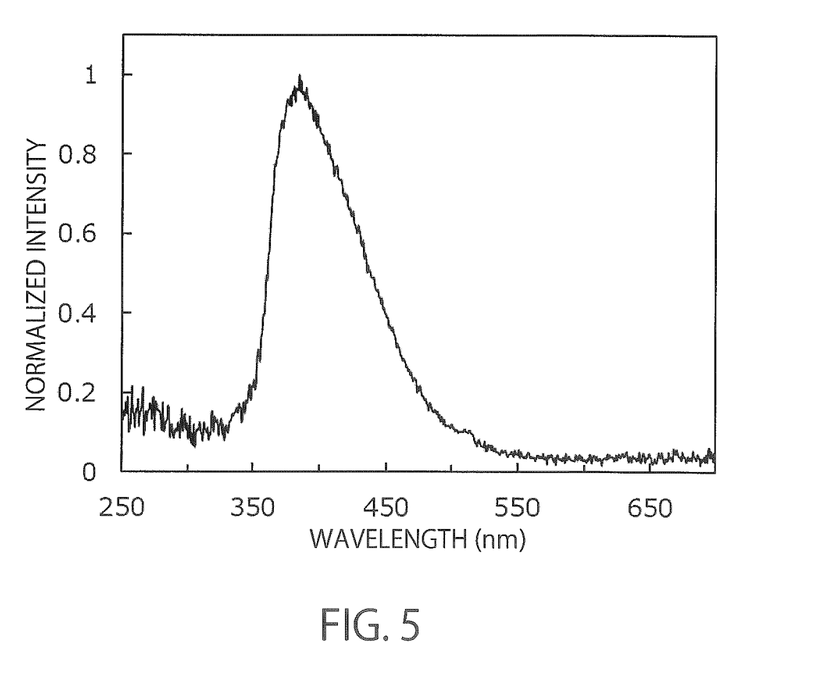
FIG. 5 is an example of the emission spectrum shown by the material in Example 5 under the excitation with electron beams.
Figure 6:
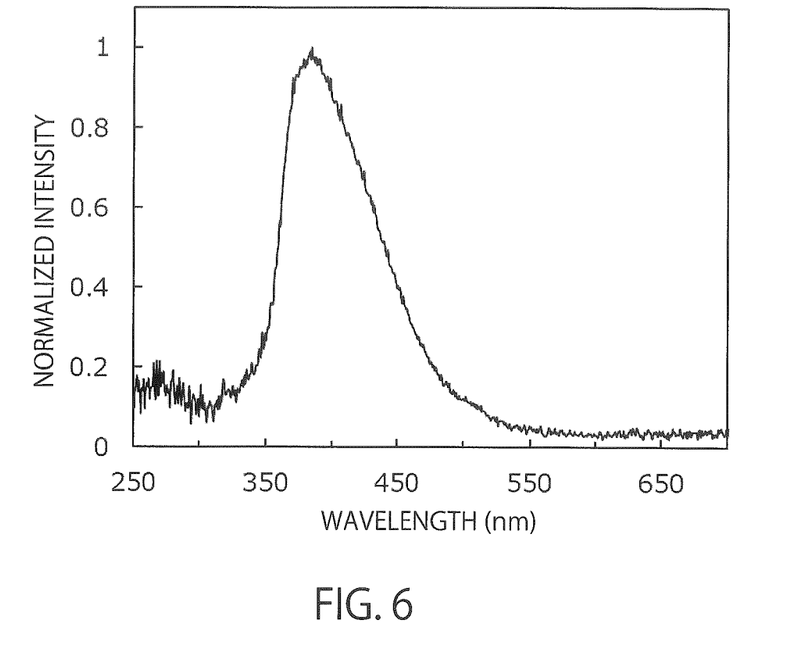
FIG. 6 is an example of the emission spectrum shown by the material in Example 6 under the excitation with electron beams.
Figure 7:
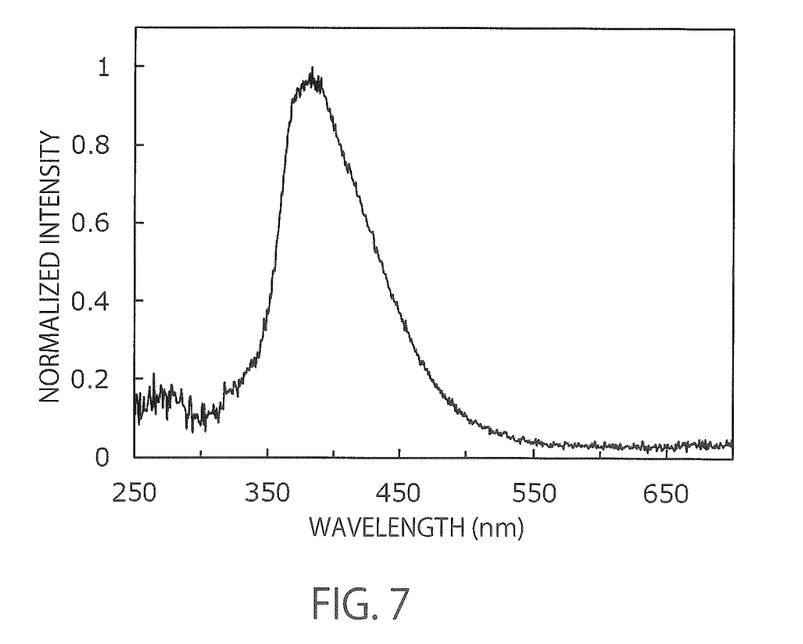
FIG. 7 is an example of the emission spectrum shown by the material in Example 7 under the excitation with electron beams.

FIG. 1 shows a scanning electron microscopic (SEM) observation image of the polycrystalline powder in Example 1. The SEM observation was carried out in the following manner. The polycrystalline powder of Example 1 was fixed on a carbon tape and observed with JSM-6510LA ([trademark], manufactured by JEOL Ltd.) by use of a scanning electron beam at an accelerating voltage of 15 kV. FIG. 1 indicates that the powdery product of Example 1 is an aggregate of poly-crystallites having particle sizes of dozens of nanometers to dozens of micrometers.

Figure 8:
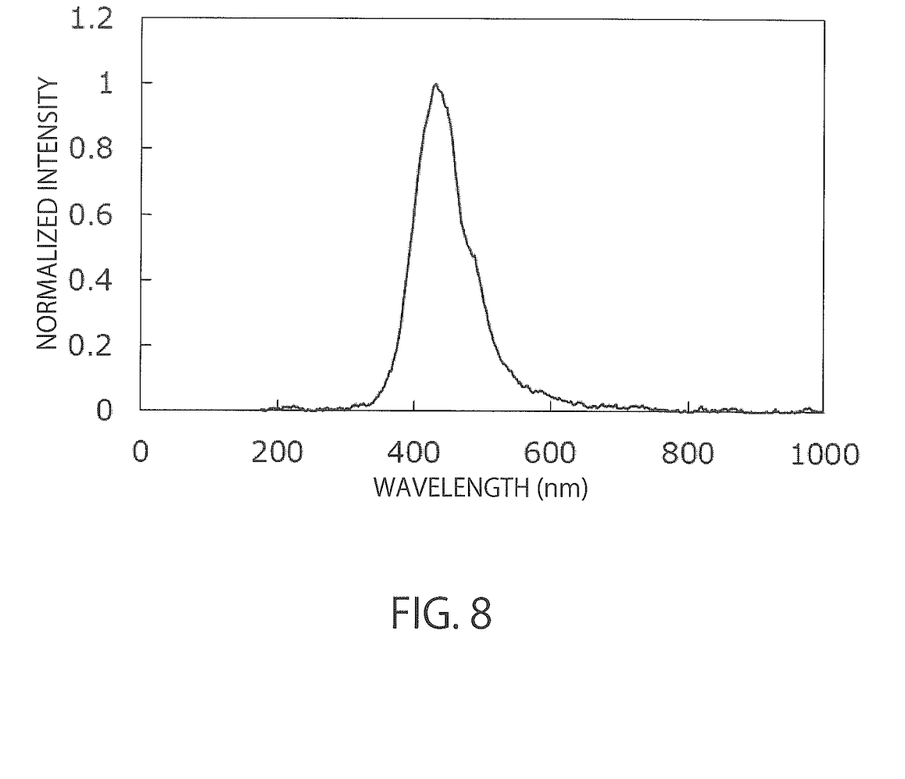
FIG. 8 is an example of the emission spectrum shown by the material in Example 11 under the excitation with X-rays.

As examples of the emission properties, FIGS. 2 to 13 show cathode luminescence (CL) spectra emitted by the materials produced in Examples 1 and 3 to 7 under the excitation with electron beams. The CL spectra were measured with a scanning electron microscope SM-510 ([trademark], manufactured by TOPCON CORPORATION) at an accelerating voltage of 10 kV and an extraction current of 200 nA. Each CL spectrum was normalized by the maximum intensity. FIG. 8 is an emission spectrum shown by the material produced in Example 11 under the excitation with X-rays. The X-ray excited emission spectrum was measured in the following manner. X-rays were generated from a Cu-target of X-ray source SA-HFM3 ([trademark], manufactured by Rigaku Corporation) under the conditions of 40 kV and 40 mA, and were then applied to the sample.

Subsequently, the emitted light was measured with a fiber multichannel spectrometer. The results indicate that the sample powders and sintered bodies of Examples are suitable for radiation detection devices.

The sample powders of Examples 1 to 7 and the sintered bodies of Example 8 to 11 were evaluated on the scintillation properties. As the radiation applied to the samples, γ-rays of 662 eV were adopted. The γ-rays were generated by a coin-shaped radiation source of $Cs^{137}$. The samples were exposed to the γ-rays, and the intensity and lifetime of the emitted luminescence were measured. Before the measurement, each sample powder was loaded in a quartz cell having an inner size of 10 mm cube. Meanwhile, the sintered bodies were directly subjected to the measurement. Each sample powder or sintered body was attached with optical grease on a photomultiplier R7600U-200 (([trademark], manufactured by Hamamatsu Photonics K.K.), and then placed in a black case made of stainless steel. Subsequently, the coin-shaped radiation source of $Cs^{137}$ was settled on the case and thereby the sample was exposed to the γ-rays radiated from the radiation source. The emitted luminescence was detected with the photomultiplier, and the obtained signals were amplified with an amplifier. The emission intensity was evaluated on the bases of the pulse wave height spectrum obtained with a multichannel analyzer, and calculated with correction based on quantum efficiency of the photomultiplier. The emission lifetime was evaluated from the scintillation decay curve obtained with a digital oscilloscope.

Table 1 shows, in summary, the thus measured emission intensities of the samples in Examples 1 to 11 under the excitation with γ-rays.

Figure 9:
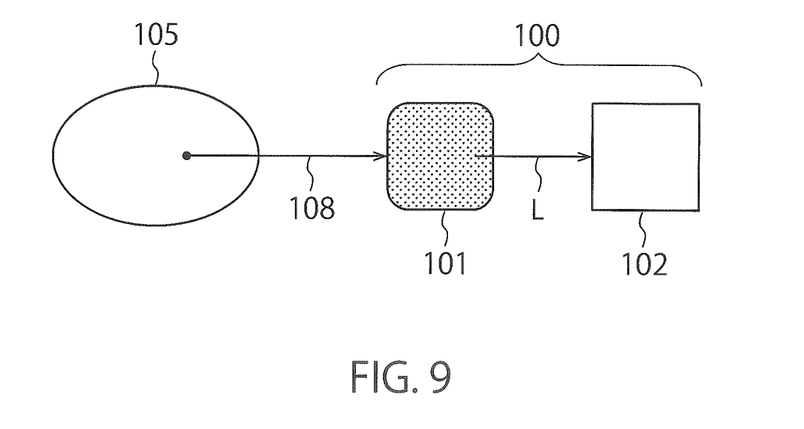
FIG. 9 schematically shows an example of the radiation detection system corresponding to Example 12.

As shown in FIG. 9, a radiation detection device 100 comprises a radiation detection material 101 and a detector 102. Examples of the radiation detection material 101 includes the materials of Examples 1 to 11 and modified substances thereof. The detector 102 detects light L emitted from the material 101, which is represented by the above formula (1).

Specifically, for example, when the test object 105 emits radiation 108 (such as γ-rays), the radiation detection material 101 receives the radiation 108 and emits the light L. The detector 102 detects the light so as to obtain information about the test object 105.

The radiation detection device 100 may be installed, for example, in an X-ray CT system.

The embodiment serves as, for example, a scintillator material.

TABLE 1

| sample | material mixture composition | processing | result of composition analysis x | y | z | emission intensity (photons/MeV) |
|---|---|---|---|---|---|---|
| Ex. 1 | $TlMgCl_3$ | heat treatment | 0 | 0.01 | 0.3 | 33000 |
| Ex. 2 | $TlCaCl_3$ | heat treatment | 0 | 0.05 | −0.1 | 17000 |
| Ex. 3 | $TlSrCl_3$ | heat treatment | 0 | 0.01 | −0.2 | 12000 |
| Ex. 4 | $Tl(Mg_{0.99}Ce_{0.01})Cl_3$ | heat treatment | 0.01 | 0 | 0.1 | 28000 |
| Ex. 5 | $Tl(Mg_{0.98}Ce_{0.02})Cl_3$ | heat treatment | 0.02 | 0.01 | 0.2 | 32000 |
| Ex. 6 | $Tl(Mg_{0.98}Ce_{0.03})Cl_3$ | heat treatment | 0.03 | 0 | 0.3 | 36000 |
| Ex. 7 | $Tl(Mg_{0.95}Ce_{0.05})Cl_3$ | heat treatment | 0.04 | −0.01 | 0.4 | 32000 |
| Ex. 8 | $TlMgCl_3$ | heat treatment + spark plasma sintering (in vacuum) | 0 | 0.02 | 0.6 | 17000 |
| Ex. 9 | $Tl(Mg_{0.99}Ce_{0.01})Cl_3$ | heat treatment + spark plasma sintering (in vacuum) | 0.01 | 0.03 | 0.7 | 17000 |
| Ex. 10 | $Tl(Mg_{0.99}Ce_{0.01})Cl_3$ | heat treatment + spark plasma sintering (in argon gas) | 0.01 | 0.01 | 0.1 | 15000 |
| Ex. 11 | $TlMgCl_3$ | spark plasma sintering (in argon gas) | 0 | 0 | 0.1 | 9000 |
| Com. | $Tl(Mg_{0.9}Eu_{0.1})Cl_3$ | heat treatment | 0 | 0.01 | 0.1 | 20000 |

Table 2 shows, in summary, the thus measured emission lifetimes of the samples in Examples 1 to 11 under the excitation with γ-rays.

When absorbing radiation such as α-rays, β-rays, γ-rays or X-rays, scintillators emit luminescence. Accordingly, radiation can be detected with a combination of a scintillator

TABLE 2

| sample | material mixture composition | processing | result of composition analysis x | y | z | emission lifetime (ns) |
|---|---|---|---|---|---|---|
| Ex. 1 | $TlMgCl_3$ | heat treatment | 0 | 0.01 | 0.3 | 368 |
| Ex. 2 | $TlCaCl_3$ | heat treatment | 0 | 0.05 | −0.1 | 449 |
| Ex. 3 | $TlSrCl_3$ | heat treatment | 0 | 0.01 | −0.2 | 484 |
| Ex. 4 | $Tl(Mg_{0.99}Ce_{0.01})Cl_3$ | heat treatment | 0.01 | 0 | 0.1 | 348 |
| Ex. 5 | $Tl(Mg_{0.98}Ce_{0.02})Cl_3$ | heat treatment | 0.02 | 0.01 | 0.2 | 300 |
| Ex. 6 | $Tl(Mg_{0.98}Ce_{0.03})Cl_3$ | heat treatment | 0.03 | 0 | 0.3 | 263 |
| Ex. 7 | $Tl(Mg_{0.95}Ce_{0.05})Cl_3$ | heat treatment | 0.04 | −0.01 | 0.4 | 267 |
| Ex. 8 | $TlMgCl_3$ | heat treatment + spark plasma sintering (in vacuum) | 0 | 0.02 | 0.6 | 300 |
| Ex. 9 | $Tl(Mg_{0.99}Ce_{0.01})Cl_3$ | heat treatment + spark plasma sintering (in vacuum) | 0.01 | 0.03 | 0.7 | 250 |
| Ex. 10 | $Tl(Mg_{0.99}Ce_{0.01})Cl_3$ | heat treatment + spark plasma sintering (in argon gas) | 0.01 | 0.01 | 0.1 | 244 |
| Ex. 11 | $TlMgCl_3$ | spark plasma sintering (in argon gas) | 0 | 0 | 0.1 | 290 |
| Com. | $Tl(Mg_{0.9}Eu_{0.1})Cl_3$ | heat treatment | 0 | 0.01 | 0.1 | 10000 |

Example 12

FIG. 9 schematically shows an example of the radiation detection device of Example 12.

and a photodiode for detecting the luminescence. Scintillators are used for various applications. For example, they are employed in medical imaging apparatuses, such as, in X-ray CT apparatuses and in PET apparatuses; also in the industrial field, such as, for nondestructive inspection; still also in the security field, such as, for baggage inspection; yet also in the resource exploration field; and further in the academic field, such as, in high energy physics.

The radiation detection device generally comprises a scintillator (radiation detection material) and a light-receiving element (detector), which receives light emitted from the scintillator and converts the light into electric signals and the like.

As an example, in an X-ray CT measurement, while the apparatus is being rotated 360 degrees around a sample or patient, X-rays are applied to the sample or patient so as to obtain two-dimensional transmission images. From the thus-obtained sequential image data, an X-ray CT image is created. The X-rays passing through the sample or patient is converted into low energy photons by the scintillator, and the photons are then converted into electric signals, for example, with a photodetector. Examples of the photodetector include photodiodes (PDs), silicon photomultipliers (Si-PMs) and photomultipliers (PMs). The electric signal date are processed with computers or the like to obtain image information. On the basis of the obtained image information, it can be revealed, for example, whether lesions are present or absent or how large the lesions are.

As another example, when the radiation detection device is used in high energy physics, the scintillator converts radiation into plural low-energy photons and the photons are then converted by a light-receiving element into electric signals.

Photodiodes (PDs) and silicon photomultipliers (Si-PMs) are widely used in radiation detection devices and imaging apparatuses. Silicon-containing PDs and Si-PMs have maximum sensitivity in a wavelength range of, for example, 450 to 700 nm, and are the most sensitive to light at around 600 nm. Accordingly, they are used in combination with, for example, a scintillator having the emission peak at around 600 nm.

As still another example, in a radiation imaging system, a scintillator array and a photodetector array are used in combination. Examples of the photodetector array include an array of position sensitive PMTs and a semiconductor photodetector array. Examples of the semiconductor photodetector array include a PD array, an avalanche photodiode array (APD array) and a Geiger-mode APD array. In the system, which scintillator emits light is determined with the photodetector array so as to estimate the radiation incident position on the scintillator array.

In order that the scintillator can be suitably used in the radiation detection device, it is desired for the scintillator to have a high density and a large atomic number (that is, to have a high photoelectric absorption ratio) in view of the detection efficiency, as an example. Further, the scintillator preferably emits light with high intensity and a short fluorescence lifetime (fluorescence decay time) in view of necessity of fast response and high energy resolution, as another example. Furthermore, the emission wavelength of the scintillator preferably corresponds to the wavelength range where the photodetector has high sensitivity, as still another example.

Scintillator materials are used in combination with photodetectors for the purpose of detecting high energy photons and particles in various applications, such as, high energy physics, medical imaging, geological survey, and homeland security. Those scintillators preferably have high scintillation light yields, rapid dynamics of scintillation (in both decay time and rising period), good energy resolution and high proportionality, and/or it is also desired for them to be relatively insensitive to external light exposure.

The embodiments make it possible to provide a radiation detection material emitting fluorescence with high intensity and short lifetime, and also to provide a radiation detection device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the invention.

The invention claimed is:

1. A polycrystalline radiation detection material represented by the following formula (1)

$$TlM_{1-x-y}Ce_xX_{3-z} \qquad (1)$$

wherein
  M is at least one element selected from the group consisting of Ca, Sr, Ba, and Mg;
  X is at least one element selected from the group consisting of Cl, Br, and F; and
  x, y and z are numbers satisfying the conditions of
    $0.001 \leq x \leq 0.1$,
    $-0.1 \leq y \leq 0.1$,
    $-0.5 \leq z \leq 1$, respectively.

2. The material according to claim 1, wherein said element M is Mg.

3. The material according to claim 1, wherein said element X is Cl.

4. The material according to claim 1, which is in the form of a sintered body.

5. An imaging plate comprising the material according to claim 1.

6. A radiation detection device which detects radiation by use of the material according to claim 1.

7. The material according to claim 1, wherein said number x satisfies the condition of $0.01 \leq x \leq 0.04$.

8. The material according to claim 1, wherein said polycrystalline radiation detection material is constituted of crystals having perovskite structures.

* * * * *

UNITED STATES PATENT AND TRADEMARK OFFICE
CERTIFICATE OF CORRECTION

PATENT NO. : 11,300,693 B2
APPLICATION NO. : 17/014291
DATED : April 12, 2022
INVENTOR(S) : Yumi Fukuda et al.

It is certified that error appears in the above-identified patent and that said Letters Patent is hereby corrected as shown below:

In the Claims

Claim 1, Column 12, Line 36, "consisting of CI," should read --consisting of Cl,--.

Claim 1, Column 12, Line 39, "-0.1≤y≤0.1," should read -- -0.1≤y≤0.1, and--.

Signed and Sealed this
Twenty-fifth Day of April, 2023

Katherine Kelly Vidal
*Director of the United States Patent and Trademark Office*